(12) United States Patent
Goss et al.

(10) Patent No.: US 9,105,360 B2
(45) Date of Patent: Aug. 11, 2015

(54) FORMING A CHARACTERIZATION PARAMETER OF A RESISTIVE MEMORY ELEMENT

(71) Applicant: Seagate Technology LLC, Cupertino, CA (US)

(72) Inventors: Ryan James Goss, Prior Lake, MN (US); Mark Allen Gaertner, Vadnais Heights, MN (US); Antoine Khoueir, Apple Valley, MN (US); David Scott Ebsen, Minnetonka, MN (US); Jon D. Trantham, Chanhassen, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 229 days.

(21) Appl. No.: 13/789,123

(22) Filed: Mar. 7, 2013

(65) Prior Publication Data

US 2014/0258646 A1  Sep. 11, 2014

(51) Int. Cl.
*G06F 12/00* (2006.01)
*G11C 29/50* (2006.01)
(Continued)

(52) U.S. Cl.
CPC .......... *G11C 29/50008* (2013.01); *G06F 11/10* (2013.01); *G11C 13/0002* (2013.01); *G11C 13/004* (2013.01); *G11C 13/0004* (2013.01); *G11C 13/0007* (2013.01); *G11C 13/0069* (2013.01); *G11C 13/00* (2013.01); *G11C 2013/0076* (2013.01); *G11C 2013/0083* (2013.01); *G11C 2013/0092* (2013.01)

(58) Field of Classification Search
CPC ............. G11C 13/0069; G11C 13/004; G11C 13/0064; G11C 11/1673; G11C 13/00; G11C 13/003; G11C 13/0061; G11C 27/005; G11C 2213/52; G11C 29/50; G11C 13/0002; G11C 13/0004; G11C 13/0007; G11C 2013/0076; G11C 2013/0083; G11C 2013/0092; G11C 29/50008; G06F 12/0238; G06F 12/0246; G06F 11/0751; G06F 12/00; G06F 11/10
USPC .......................................... 711/103; 365/148
See application file for complete search history.

(56) References Cited

U.S. PATENT DOCUMENTS

| | | | |
|---|---|---|---|
| 8,238,149 B2 | 8/2012 | Shih et al. | |
| 8,264,895 B2 | 9/2012 | Rao | |
| 2006/0104120 A1* | 5/2006 | Hemink | ................... 365/185.28 |

(Continued)

OTHER PUBLICATIONS

Pozidis et al. "Enabling Technologies for Multilevel Phase-Change Memory", European Phase Change and Ovonics Symposium 2011, 8 pages.

*Primary Examiner* — Hashem Farrokh
(74) *Attorney, Agent, or Firm* — Hollingsworth Davis, LLC (57) ABSTRACT

An incremental signal is defined that includes at least one of a duration and a peak voltage that is less than a respective minimum programming time or minimum programming voltage step of a resistive memory element. A characterization procedure is repeatedly performed that at least involves: applying a signal to the memory element, the signal being incremented by the incremental signal during each subsequent application; measuring a first resistance of the memory element in response to the signal; and c) measuring a second resistance of the memory element after a time period has elapsed from the measurement of the first resistance with no programming signal applied. In response to the first and second resistance measurements of the characterization procedure, a characterization parameter of the memory element is formed.

22 Claims, 6 Drawing Sheets

(51) Int. Cl.
  *G06F 11/10* (2006.01)
  *G11C 13/00* (2006.01)

(56) References Cited

U.S. PATENT DOCUMENTS

| | | | |
|---|---|---|---|
| 2011/0110144 A1* | 5/2011 | Kawai et al. | 365/148 |
| 2012/0120712 A1* | 5/2012 | Kawai et al. | 365/148 |
| 2012/0188813 A1* | 7/2012 | Chien et al. | 365/148 |
| 2012/0266115 A1 | 10/2012 | Gabric et al. | |
| 2013/0155760 A1* | 6/2013 | Houssameddine | 365/158 |
| 2013/0250651 A1* | 9/2013 | Sills | 365/148 |

\* cited by examiner

FORMING A CHARACTERIZATION PARAMETER OF A RESISTIVE MEMORY ELEMENT

SUMMARY

The present disclosure is related to forming a characterization parameter of a resistive memory element. In one example, methods, apparatuses, and instructions stored on a computer-readable medium facilitate defining an incremental signal that includes at least one of a duration and a peak voltage that is less than a respective minimum programming time or minimum programming voltage step of a resistive memory element. A characterization procedure is repeatedly performed. The characterization procedure at least involves: a) applying a signal to the resistive memory element, the signal being incremented by the incremental signal during each subsequent application; b) measuring a first resistance of the resistive memory element in response to the signal; and c) measuring a second resistance of the resistive memory element after a time period has elapsed from the measurement of the first resistance with no programming signal applied. In response to the first and second resistance measurements of the characterization procedure, a characterization parameter of the resistive memory element is formed. A data access operation affecting the resistive memory element is modified using the characterization parameter.

In another embodiment, methods, apparatuses, and instructions stored on a computer-readable medium facilitate repeatedly performing a characterization procedure. The characterization procedure involves applying a signal to a selected element of the plurality of resistive memory elements. A peak voltage of the signal is incremented an incremental voltage that is less than a minimum programming voltage step of the selected element. The characterization procedure further involves measuring a first resistance of the selected element in response to the signal being applied and measuring a second resistance of the selected element after a time period has elapsed from the measurement of the first resistance with no programming signal applied. A data access operation affecting the selected element is modified in response to the first and second resistance measurements of the characterization procedure.

These and other features and aspects of various embodiments may be understood in view of the following detailed discussion and accompanying drawings

BRIEF DESCRIPTION OF THE DRAWINGS

In the following diagrams, the same reference numbers may be used to identify similar/same components in multiple figures.

DETAILED DESCRIPTION

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the claims appended hereto.

The present disclosure is generally related to persistent data storage devices, such as devices using resistive memory storage. Resistive memories may include any memory that uses persistent changes in resistance of a memory cell in order to store data. Resistive memories may include, but are not limited to, resistive random access memory (RRAM, ReRAM, or memristor) and phase-change memory (PCM). While each of these memory types may have different characteristics and advantages, effective use of memory devices using the different memory types may involve effectively managing physical changes in the media in response to aging of the media and/or based on workload of the media.

The present disclosure relates to compensating for shifts in resistance of resistance based memory over time. The compensation may involve any combination of using adaptive error-correction codes (ECC), modifying program and read behavior, using specific data storage formats, and active management of the media. These compensation techniques may be used in combination, and each will be discussed in greater detail below. The techniques may be used in a data storage device, such as the storage device 100 shown in FIG. 1.

Figure 1:
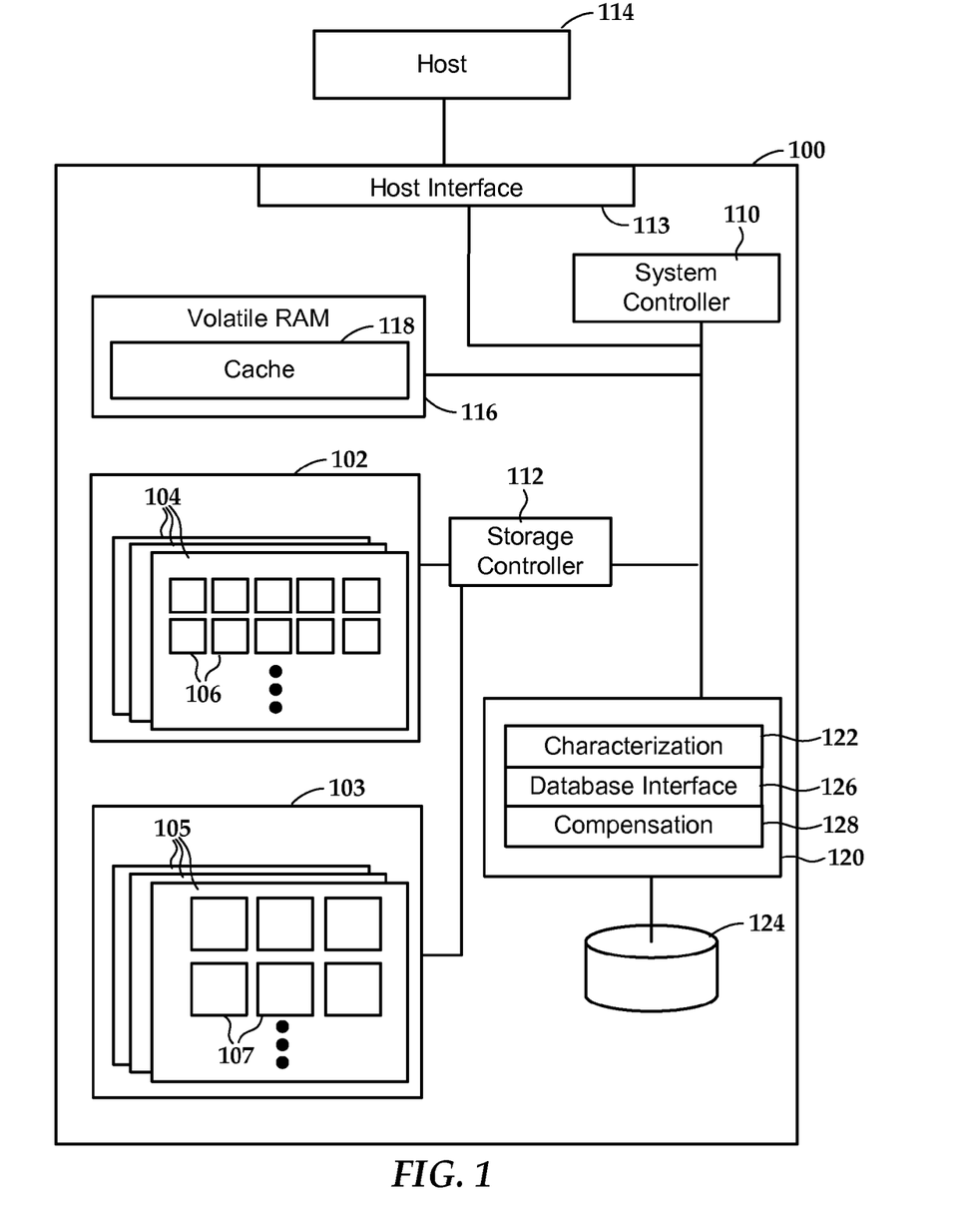
FIG. 1 is a block diagram of an apparatus according to an example embodiment.

In FIG. 1, a block diagram illustrates a data storage device 100 according to an example embodiment. This device 100 may be configured as a solid-state drive (SSD) (or sub-component thereof) that utilizes any combination of solid state memory. The features of the device 100 may be applicable to other types of hard drive devices, such as hybrid drives that use a combination of solid state memory and magnetic disks. The features of the device 100 may also be applicable to special-purpose solid-state and/or disk data storage devices (or sub-components thereof) that do not utilize standard hard drive data interfaces.

The device 100 may include one or more memory units 102, 103 that contain some or all of the non-volatile memory of the device 100. The memory units 102, 103 may include one or more respective discrete physical units 104, 105, e.g., memory chips, dies, packages, planes etc., or logical units or groupings thereof. In this example, the memory units 102, 103 are non-hierarchical units, and the respective physical units 104, 105 each contain a different type of non-volatile memory storage media from the other. Within each of the physical units 104, 105, the memory may be grouped into smaller blocks 106, 107. Because the underlying media of the physical units 104, 105 are different, the memory sizes of the blocks 106, 107 may differ. While two memory units 102, 103 are shown in this example, the concepts described herein may be employed in devices having more units of different media types, or having a single memory unit of a single storage media type.

The device 100 may include one or more system controllers 110 that facilitate servicing requests received from a host 114 via a host interface 113. The system controller 110 generally receives read or write requests from the host 114 referencing logical addresses. The system controller 110 translates the logical addresses to physical addresses, and performs respective read or write operations on the appropriate physical addresses of the memory units 102, 103. The system controller 110 may direct a storage controller 112 to perform the operations that affect the memory units 102, 103. It is worth noting that in some alternative embodiments, such as in some PCIe-connected data storage devices, that the system controller does not exist as a physical entity, but a logical entity inside a computer device driver.

A storage controller 112 is a specialized controller that applies signals to perform reading and writing to one or more memory units 102, 103. The storage controller 112 may include encoders and decoders, or encoding/decoding may be performed by a separate unit (not shown). If multiple memory units 102, 103 are used, multiple storage controllers 112 may be employed to perform read/write operations appropriate for the particular memory type. The separate storage controllers 112 may utilize different physical addressing conventions appropriate to the particular memory architecture. In such a case, the primary system controller 110 may transform a logical host address to an internal logical address usable by the storage controllers 112 associated with each of the memory units 102, 103.

The device 100 may include volatile random access memory (RAM) 116 that may be used for, among other things, a volatile cache 118 for the non-volatile memory units 102, 103. Generally, the volatile cache 118 is a hierarchical memory structure that mirrors portions of the non-volatile memory 102, 103, but can be read from and/or written to more quickly than the non-volatile memory 102, 103. For some situations, e.g., data that sees repeated read/write activity over a short period of time, the volatile cache 118 will increase performance.

As previously noted, memory units 102, 103 may be configured as non-hierarchical units that contain a different types of memory storage media. For example, the memory units 102, 103 may each be different ones of flash memory, resistive RAM (also known as ReRAM, RRAM, and memristor), spin-torque RAM (STRAM), or phase-change memory (PCM) units. For purposes of this disclosure, at least one of the memory units 102, 103 are resistive memory units, e.g., ReRAM and PCM.

Resistive memory uses memory elements (e.g., cells) that generally exhibit a predetermined resistance that can be shifted by the application of electrical signals to the cells. For example, PCM cells change from an amorphous, crystalline, and intermediate states (and back) upon the application of a particular voltage, and the resistance is measurably different between those states. An RRAM cell includes a dielectric through which conductive paths can be formed/removed by the application of the appropriate voltage, which results in a variable resistance being detected through the dielectric.

A resistive memory cell may store one or more bits of data. If one bit is stored per cell, the value of the stored data is determined by measuring the resistance level of the cell and determining if it is above or below a defined threshold. Similarly, multiple bits can be stored by defining and detecting more than one threshold per cell. While multiple-bit cells can result in greater storage density, they may be more prone to error due to the need to more finely discern resistance measurements. Whether a resistive memory cell stores one bit or more than one bit, it may be susceptible to differences in how particular cells respond to programming voltages, neighboring activity, the passage of time, and other usage/environmental factors.

Resistive memory cells may exhibit variance in response to programming voltages (or currents) due to manufacturing differences. Some of the variances can be accounted for by iterative programming, e.g., programming to a first level, reading back the resistance, and doing the same for subsequent programming levels until a target resistance is read back. However, there may be some cases where a cell drifts shortly after programming, e.g., due to thermal affects, and such drift may vary between cells. Over longer periods of time, the resistance levels of the memory cells may shift due to a number of factors, e.g., temperature, material breakdown, number of cycles, retention time, read/write disturb, etc.

Unpredictable resistance shifts of resistance memory cells can cause decreased performance, e.g., requiring additional error correction measures or redundancy. These shifts may also affect endurance and/or retention, e.g., data stored for long periods of time may exhibit significant bit error rate (BER) and/or become unreadable. These errors may become even more pronounced when the memory cell is used to store more than one bit. There are a number of ways to compensate for shifts in resistance, including adaptive error correction codes, modifying program and read behavior, using specific data storage formats, and active management of the media. However, in order to apply such compensation, there may need to be a uniform way to characterize performance of particular memory cells.

Accordingly, the data storage device 100 includes one or more functional modules 120 that facilitate characterizing memory cells of the memory units 102, 103. The functional modules 120 may include custom logic circuitry and/or instructions stored in a computer-readable medium. A characterization module 122 is operable via the system controller 110 and/or storage controller 112 to apply incremental programming signals to memory cells and read back resistances of the cells after a dwell time. The characterization module 122 may store characterization data in a persistent data store 124 via a database interface 126. The data store 124 is preferably stored in non-volatile memory, such as in a separate partition of memory units 102 or 103, but may also be kept in volatile memory, or one-time-programmable memory (not shown). The database interface 126 may facilitate storing the data in a compact format that is mapped/indexed to a memory address or range of addresses. A compensation module 128 is configured to retrieve the characterization data via the database interface 126 and apply compensation during normal operation, e.g., in response to host-requested read and write commands.

Figure 2:
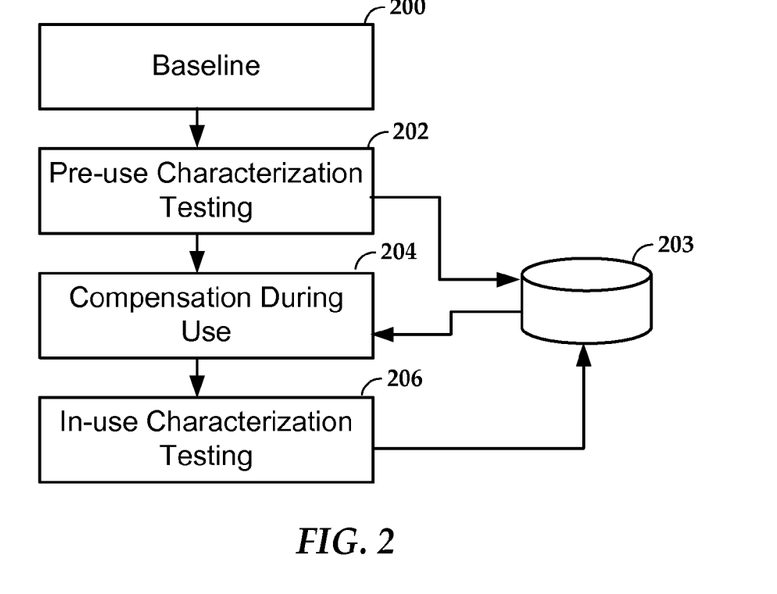
FIG. 2 is a block diagram illustrating stages of characterization testing according to an example embodiment.

In reference now to FIG. 2, a block diagram illustrates operational principles of compensation and characterization modules according to an example embodiment. Generally, a memory device may be configured to operate at a baseline level 200 according to nominal manufacturing specifications of media. A large number of the manufactured memory devices may be able to operate with acceptable performance using baseline level configuration 200, although even those that do not perform to expectation with regards to some aspects, e.g., BER, may still be able to pass testing in other areas (e.g., address multiplexing and de-multiplexing). Further the performance degradation may be correctable via changes to the baseline configuration 200.

A second manufacturing or post-manufacturing characterization testing 202 may be performed on some or all memory devices before being place into service (e.g., integrated with other components, shipped for use). This pre-use testing 202 may be performed on all cells or a selected subset of cells, and results in characterization data that can be persistently stored in a database 203 that is part of the shipping product. The pre-use testing 202 may be performed under controlled conditions, e.g., variations in temperature, applied voltage, etc. A heating element may be placed under the storage device to control the temperature, and while doing the testing to perform accelerated and/or more accurate characterization. Temperature measurement capabilities may be built into the physical memory devices (e.g., dies) to more accurately predict temperature-based changes. Data from the pre-use testing 202 may be aggregated between a number of different devices during manufacture if trends are apparent.

The stored characterization data 203 can be accessed 204 during use, e.g., by a system or storage controller, to adjust various parameters such as thresholds, read/write voltage levels, read/write pulse durations, error-correction levels, etc. Although the characterization data may be measured for a subset/sample of cells, the parameters may be used to modify access operations (or perform other management operations) that affect a plurality of cells related to the subset, e.g., all cells in a same physical memory block as the subset. The device may re-characterize and recalibrate predictions after initial characterizations (e.g., closed-loop feedback). Recalibrations and weighting adjustments of individual predictor functions may be performed based on accuracy of previous predictions versus measured data.

One or more times after the device is in use, an in-use testing procedure 206 may be performed to update stored characterization data 203 to account for factors such as age, environmental conditions, host-specific workloads or idiosyncrasies, etc. The particular conditions (e.g., temperature) may be measured at the same time the in-use testing is performed so that any results can be adjusted or weighted if the conditions warrant. Triggers for re-characterization may include power-on boot-up, after errors above a threshold quantity or magnitude have occurred, or periodically over time.

Figure 3:
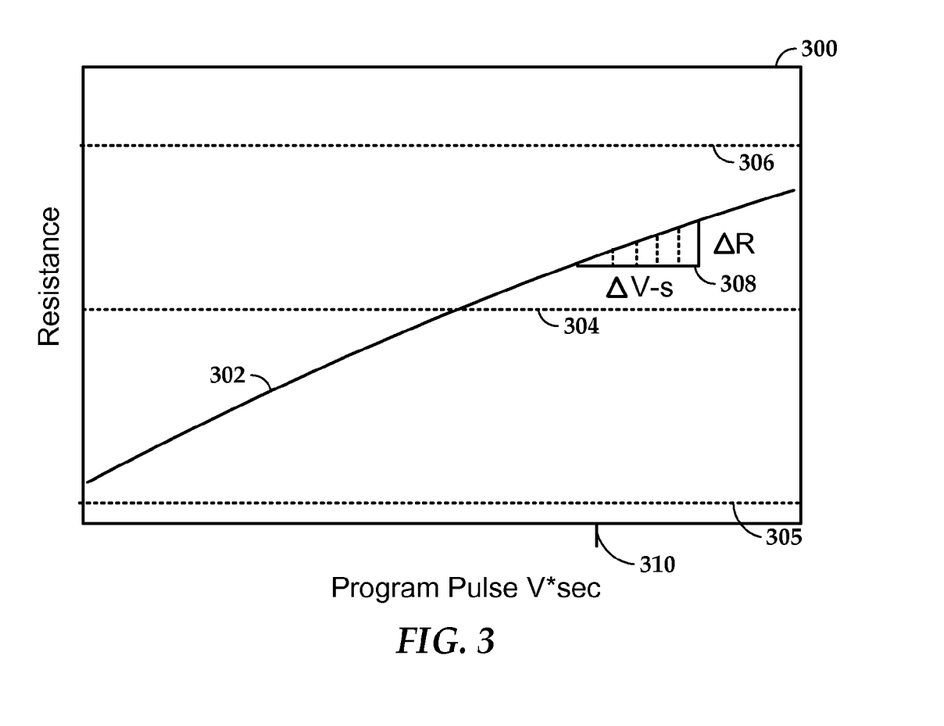
FIG. 3 is a graph illustrating programming signal responses used to obtain characterization parameters according to an example embodiment.

In FIG. 3, a graph 300 illustrates programming signal responses used to obtain characterization parameters according to an example embodiment. The vertical axis of the graph represents a measured resistance value of the cell and the horizontal axis represents a programming pulse used to impart a particular resistance to the cell in one direction. The pulse value is represented here by an area under the pulse (e.g., voltage times duration for a square wave). Depending on the actual media, only one of a pulse level or pulse duration may be altered to program the cell and cause a resistance change as indicated. Further, a shape of the pulse may cause different performance characteristics that are not reflected by the V*sec area of the pulse.

It will be understood that the graph is provided for purposes of illustration, and is not intended to represent actual cell performance. For example, curve 302 is intended to represent performance of a particular cell, but for some media the curve may have an opposite slope, shape, and/or may be jagged or discontinuous. For purposes of this discussion, a negative pulse (e.g., reverse voltage polarity) may be assumed to cause resistance to change along the curve in a left-hand direction. However, for a given cell type, a curve for causing a change of resistance in the opposite direction may have a significantly different shape.

In graph 300, line 304 represents a threshold resistance value used to distinguish between two bit values of the cell, and lines 305, 306 represent respective theoretical minimum and maximum resistances of the cell. In order to quickly set the desired resistance, a storage controller may use large programming pulse step. For example if the cell is initially at or near the minimum resistance value 305, it may be read as a zero. To program the cell to a one, a pulse value 310 on the horizontal axis may be used to set the value. For a single level cell, an even larger value may be used, as there may be little or no penalty for overshooting as far as storing the correct value. However, overly large programming voltages may cause additional wear to the cell, and reduce power efficiency. If the cell stores multiple bit values, then overshooting the desired resistance value may also result in an incorrect value being stored in the cell.

In order to prevent overshoot, the pulses may be applied gradually using a minimum programming voltage step and/or minimum pulse duration as indicated by step 308. Generally, the size of the minimum step 308 may be selected to ensure significant change in resistance without overshoot. A storage controller may be able to program using longer durations and/or larger voltage steps than the minimum step 308, but it is expected the controller may define at least one minimum step per direction of programming.

The minimum programming step 308 may be chosen based to optimize speed or efficacy of programming, however it may not necessarily be chosen based on read resolution and/or whether a smaller voltage/duration measurably affects the cell. As indicated by the broken lines within the example minimum step 308, a controller may be configured to increment pulse parameters at smaller values of time and/or voltage to perform characterization testing as described herein. Application of an incremental programming signal to a memory cell according to an example embodiment is shown in the block diagram of FIG. 4.

Figure 4:
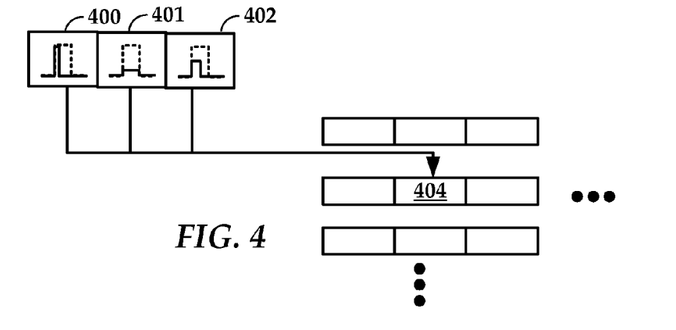
FIG. 4 is a block diagram illustrating applying an incremental programming signal to a memory cell according to an example embodiment.

In FIG. 4, one or more incrementally varied programming signals 400-402 are applied to a memory cell 404. The incremental signals 400-402 are shown in each block overlaid on a minimal programming signal, which is shown in dashed lines. Signal 400 has a shorter duration than the minimum programming signal, signal 401 has a lower peak voltage than that of the minimum programming signal, and signal 402 has both lower peak voltage and shorter duration than the minimum programming signal.

Figure 5:
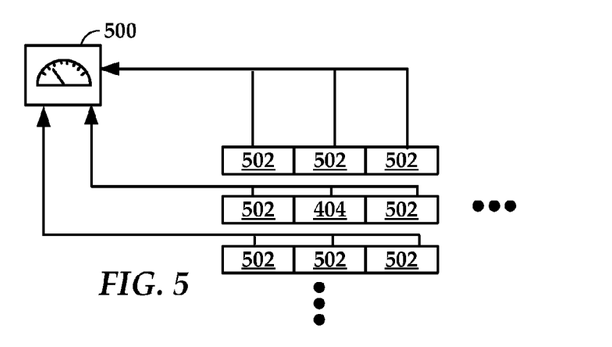
FIG. 5 is a block diagram illustrating making resistance measurements of a memory cell according to an example embodiment.

After an incremental programming signal is applied as shown in FIG. 4, subsequent measurements of resistance may be made as shown in FIG. 5. A measuring circuit 500 determines resistance of at least the affected cell 404, and optionally one or more neighboring cells 502. Other, non-neighboring cells may also be measured. For example, some or all of the media could be scanned to determine high-disturb coupling. The measuring circuit 500 generally applies a relatively small voltage (compared to programming voltage) to the cell or cells 404, 502, and measures current flow. In an alternative embodiment, a current can be applied to the cell and the voltage across it can be measured. In both embodiments the cell's resistance can be calculated by using Ohm's Law, R=E/I.

Figure 6:
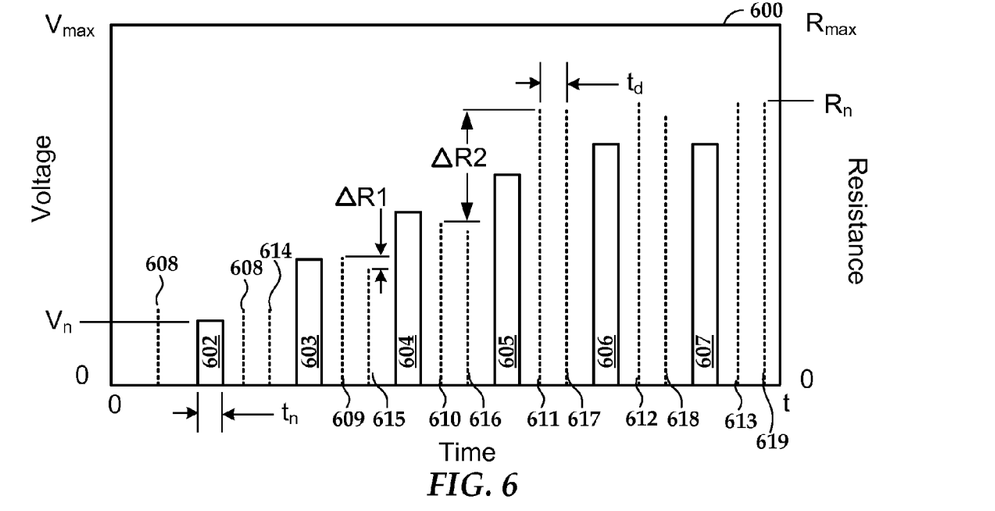
FIG. 6 is a block diagram illustrating a resistive memory cell characterization sequence according to an example embodiment.

Generally, a characterization test may involve multiple iterations of applying minimal programming signals and measurements as shown respectively in FIGS. 4 and 5. In FIG. 6, a graph 600 illustrates a resistive memory cell characterization sequence according to an example embodiment. The horizontal axis represents time, increasing from left to right. The vertical axis on the left represents voltage for applied signals (solid lines) and on the right represents measured resistance (dashed lines).

A sequence of programming signals 602-607 are repeatedly applied to a selected resistive memory element (e.g., cell). A difference between subsequently applied signals is referred to herein as an "incremental signal." As shown by programming signal 602, each signal 602-607 may be associated with a peak voltage $V_n$ and duration $t_n$. In this example, $t_n$ is the same for all signals 602-607, and $V_n$ is increasingly larger for each subsequent pulse 602-607. Thus the incremental programming signals in this example would have a duration of $t_n$ and peak voltage equal to difference in subsequent $V_n$ (which vary over time in this example).

While it is anticipated that the absolute value of some or all $V_n$ will be below a minimum programming step value, a peak voltage of the incremental signals used to modify each $V_n$ are below the minimum program voltage step. For example, one or both of pulses 605 and 606 may have an absolute peak voltage value that is greater than minimum programming voltage step, but the peak voltage difference between the two is below a minimum programming voltage step size. The incremental signal need not remain constant during the entire test. Some incremental signals may have zero change as shown by signals 606 and 607, or negative change (not shown).

After the signals 602-603 are applied, first resistances 608-613 of the selected memory element are measured. After another period of time has passed after measurement of first resistances 608-613 during which no programming signals have been applied (e.g., dwell time $t_d$), second resistances 614-619 of the selected memory element are measured. The application of one signal and measuring of first and second resistances in response thereto is referred to herein as a "characterization procedure," and a characterization test involves one or more repetitions of the characterization procedure. The characterization procedures may be repeatedly performed until a predetermined programming state is reached. For example, a maximum or minimum programming voltage or cell resistance may be reached. In another example, a predetermined number of repetitions may be performed without consideration of programming state.

Differences between any combinations of the first and second resistances 608-613 can be used to form a characterization parameter of the selected resistive memory element. For example, a resistance difference ΔR1 between the first resistance and the second resistance in the same repetition of the characterization procedure may be used to characterize the selected element, e.g., whether the values settle after the dwell time has passed. A number of the ΔR1 values (e.g., one for each repetition) may be statistically combined (e.g., average, mode, median, weighted average, curve fit as a function of resistance) to form the characterization parameter.

Another resistance difference ΔR2 represents changes in the first resistances between different repetitions of the characterization procedure (e.g., change between first resistances 610 and 611, 610 and 612, etc., in the chart 600). The value of ΔR2, along with incremental values of the programming signal, may be used to determine at least part of a curve as shown in FIG. 3. A similar ΔR2 (not shown) may be found by determining changes in the second resistances between different repetitions of the characterization procedure (e.g., change between second resistances 614 and 615 in the chart 600). A number of the ΔR2 values (e.g., one for each repetition) may be statistically combined (e.g., average, mode, median, weighted average, curve fit as a function of resistance) to form the characterization parameter.

The procedure shown in FIG. 6 may be varied in a number of ways. For example, different signals 602-607 are possible than what is illustrated here, including varying $t_n$, different pulse shapes, etc. If an incremental time value is defined, then the shape of the applied signals may become wider (longer duration) without changing peak voltage (or in addition to a change in peak voltage). A similar gradual change may be applied to a shape of the pulses, e.g., slowly transitioning from a triangle wave to a square wave, and vice versa. In such a case, an incremental signal may be defined that can be mathematically added to a signal that results in subsequent signals showing a change in pulse shape for each application of the signals 602-607. This incremental signal has at least one of a duration and a peak voltage that is less than a respective minimum programming time or minimum programming voltage step normally used in programming the resistive memory elements.

In other variations, third (and optionally fourth) resistances of neighboring memory cells/elements (e.g., cells physically proximate the memory selected element) may be measured in response to the signals 602-607 applied to the selected memory element. The third and/or fourth resistances may be measured at same or similar times as one or both of first and second resistances 608-613 of the selected memory element, e.g., in response to signals 602-607 being applied to the selected memory element. These third and/or fourth resistance values of neighboring memory elements may be used to determine whether a block of data exhibits significant disturb due to activity in neighboring cells.

The stored characterization data found using a procedure such as shown in FIG. 6 may be indicative of a repeatable but correctable error, in which case access operations such as programming and read operations can be adapted to minimize data errors. Some factors, like significant ΔR2, may be indicative of wear or faults in the cell. In such a case, the characterization data can be used in predicting long-term degradation of the resistive memory elements. These data can be used with self-monitoring features, such as SMART, to predict device failure and wearout, such as described in U.S. Publication 2010/0061207.

For example, certain response discrepancies may be indicative of early aging of memory cells. In response, error-correction codes and/or redundancy used with the resistive memory elements, such as by adapting a length of an error correction code used with the memory cell. Wear of the resistive memory elements may also be managed if the cells exhibit early wear/aging, such as by storing cold data (e.g., data seeing little read/write activity) in the cells. A quality-of-service may be assigned to resistive memory elements exhibiting early wear/aging. This may ensure that critical data is not stored on the cell if its reliability is suspect, and/or if reading the data stored in the cell takes an inordinate amount of time.

Figure 7:
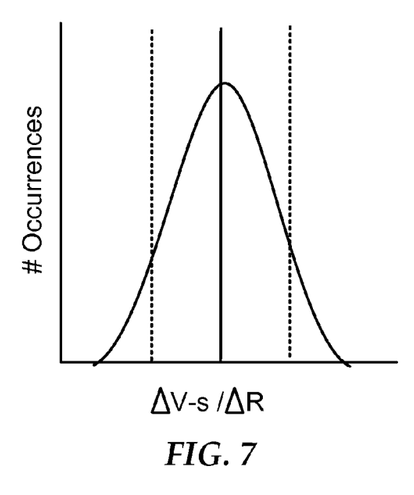
FIGS. 7-10 are histograms illustrate examples of how a population of cells may be characterized based on the tests according to example embodiments.
Figure 8:
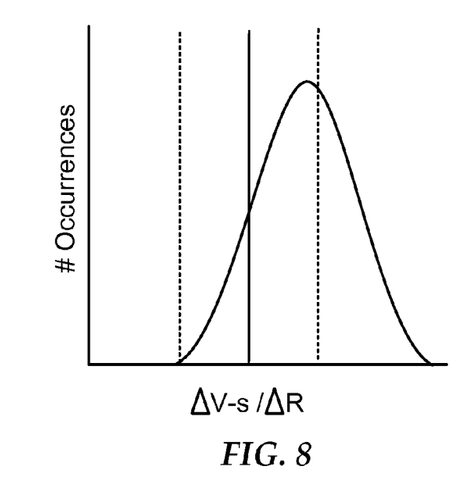
Figure 9:
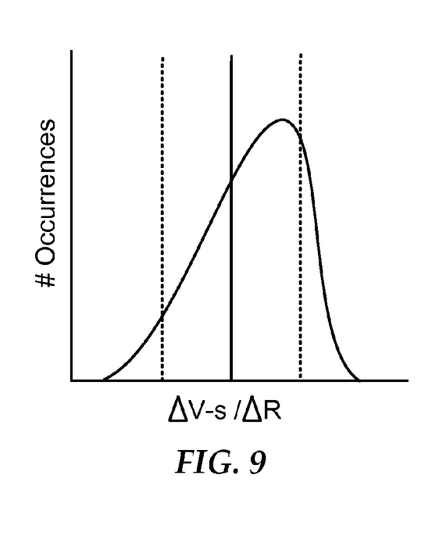
Figure 10:
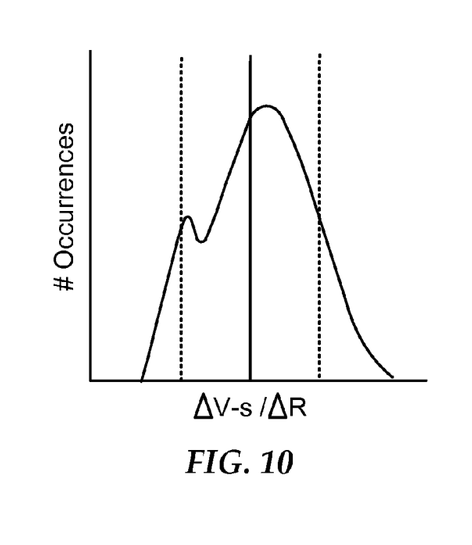

In reference now to FIGS. 7-10, histograms illustrate examples of how a population of cells may be characterized based on the tests described herein. The horizontal axes in all of FIGS. 7-10 are ratios indicating a slope of at least one point on a curve such as curve 302 in FIG. 3. The ΔR in this case may be either of ΔR1 or ΔR2 shown in FIG. 6. The values of ΔV–s/ΔR may be normalized, e.g., to account for non-linearity of the curve 302. In all of FIGS. 7-10, dashed lines indicate an allowable range of values. The histogram in FIG. 7 represents a normal (Gaussian) distribution of values. In FIG. 8, the values are normal but skewed. The histograms in FIGS. 9 and 10 are non-normal distributions.

The distribution of values in FIGS. 7-10 may be indicative long-term degradation or other factors of resistive memory cells. Cells that lie outside the allowable ranges may have different programming and/or read signals applied compared to those within the allowable range. Cells that lie outside the allowable ranges may be managed using adaptive error-correction codes, provided with increase redundancy, subjected to more or less wear of the resistive memory element, assigned a different quality-of-service metric, etc.

Figure 11:
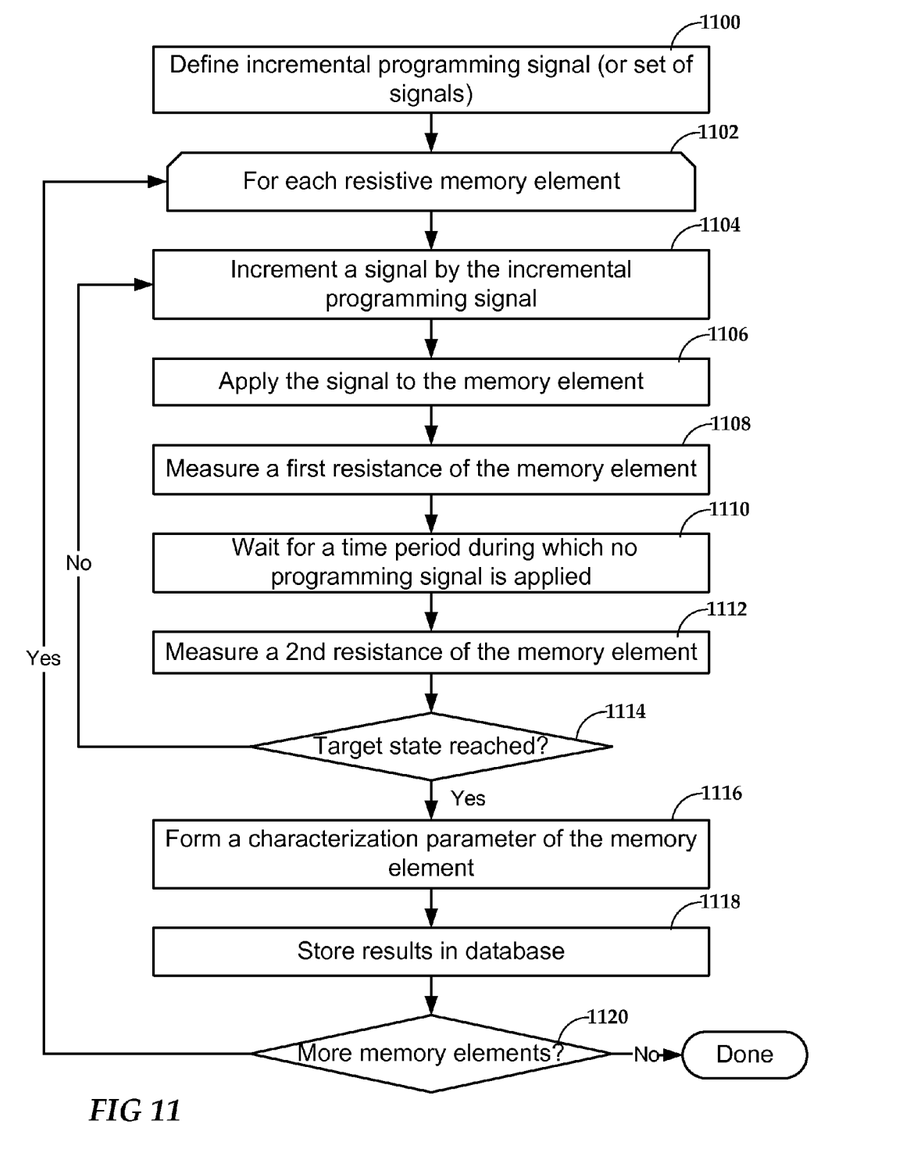
FIGS. 11 and 12 are flowcharts illustrating methods according to example embodiments.

In reference now to FIG. 11, a flowchart illustrates a method according to an example embodiment. An incremental signal (or set of signals) is defined 1100. The incremental signal has at least one of a duration and a peak voltage that is less than a minimum programming time or minimum programming voltage step of a resistive memory element. The incremental signal is used in a characterization procedure applied to a group of memory elements. The characterization procedure starts after loop limit 1102, which iterates over each element.

A signal is incremented 1104 by the incremental programming signal. For the first time, the signal may be set equal to the incremental programming signal. For subsequent repetitions, a voltage, shape, and/or duration of the incremental programming signal is added to the previous signal. The signal is applied 1106 to the currently selected resistive memory element, and a first resistance of the resistive memory element is measured 1108 in response to the signal.

The procedure waits 1110 for a time period beginning from when the first resistance is measured 1108, during which no programming signal is applied. Thereafter, a second resistance of the resistive memory element is measured 1112. At block 1114, it is determined whether a target state is reached (e.g., target resistance, target voltage, target rate of change, number of repetitions), and if not, the characterization procedure is repeated.

If the target state is reached, the resistance measurements of the characterization procedure are used to form 1116 a characterization parameter of the resistive memory element, and the results stored 1118 in a database for later use. If it is determined 1120 there are more memory elements to analyze, then the characterization procedure is used to determine characterization parameters for those additional elements.

Figure 12:
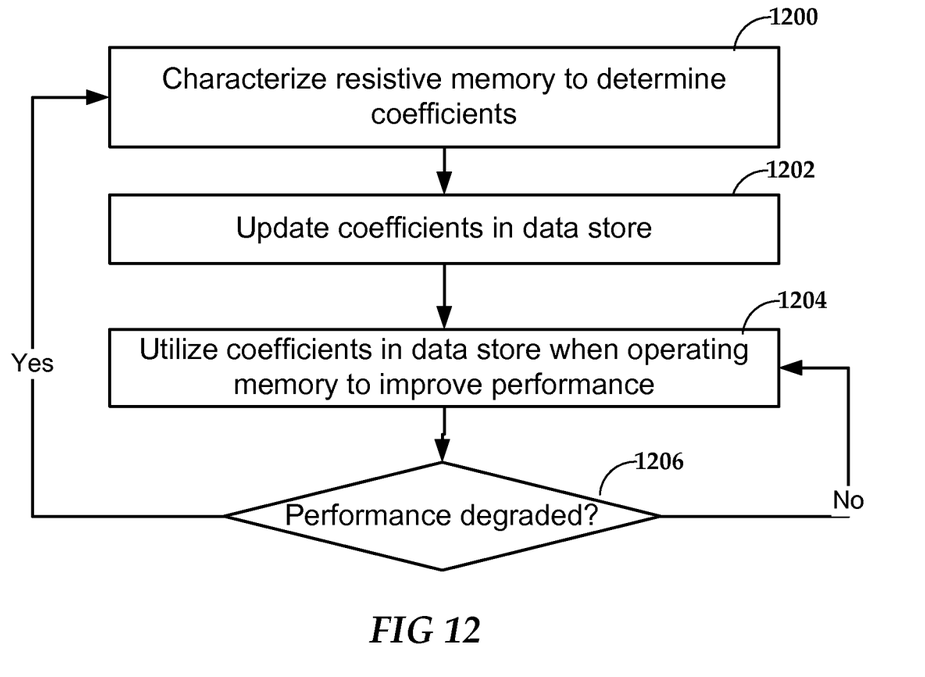

In reference now to FIG. 12, a flowchart illustrates a method according to an example embodiment. The method involves characterizing 1200 resistive memory to determine coefficients. The characterization 1200 may involve, for example, applying a signal to resistive memory elements, a peak voltage of the signal being incremented an incremental voltage that is less than a minimum programming voltage step. In such a case, a first resistance of the selected element is measured in response to the signal being applied, and a second resistance is measured after a time period has elapsed from the measurement of the first resistance with no programming signal applied. The first and second resistances may be used, among other things, to form the coefficients. For example, the coefficients may be based on changes in the first resistances between different repetitions of the characterization procedure changes in the second resistances between different repetitions of the characterization procedure. In another example, the coefficients may be based on a difference between the first resistance and the second resistance of a same repetition of the characterization procedure.

The method further involves updating 1202 coefficients in a data store (e.g., data store 124 in FIG. 1). Thereafter, the coefficients in the data store may be utilized 1204 when operating the memory to improve performance. For example, the coefficients may be used to: predict long-term degradation of the resistive memory elements; manage error-correction codes used with the resistive memory elements; manage redundancy used with the resistive memory elements; manage wear of the resistive memory elements; and/or assign a quality-of-service to the resistive memory elements. Occasionally, it may be determined 1206 if the performance degrades with the current coefficients. If so, the characterization 1200 and update 1202 may be repeated.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a computer-readable medium and transferred to the processor for execution as is known in the art. The structures and procedures shown above are only a representative example of embodiments that can be used to facilitate managing caching in data storage devices as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method comprising:
defining an incremental signal that comprises at least one of a duration and a peak voltage that is less than a respective minimum programming time or minimum programming voltage step of a resistive memory element;
repeatedly performing a characterization procedure involving:
applying a signal to the resistive memory element, the signal being incremented by the incremental signal during each subsequent application;
measuring a first resistance of the resistive memory element in response to the signal; and
measuring a second resistance of the resistive memory element after a time period has elapsed from the measurement of the first resistance with no programming signal applied;
forming a characterization parameter of the resistive memory element in response to the first and second resistance measurements of the characterization procedure; and
modifying a data access operation affecting the resistive memory element using the characterization parameter.

2. The method of claim 1, wherein the characterization parameter is based on at least one of:
changes in the first resistances between different repetitions of the characterization procedure; and
changes in the second resistances between the different repetitions of the characterization procedure.

3. The method of claim 1, wherein the characterization parameter is based at least one difference between the first resistance and the second resistance measured in a same repetition of the characterization procedure.

4. The method of claim 1, wherein the method is performed in a test of an apparatus comprising the resistive memory element before the apparatus is placed into service.

5. The method of claim 1, wherein the method is performed during user operation of an apparatus, the apparatus comprising the resistive memory element.

6. The method of claim 1, wherein the characterization procedure is repeated until a predetermined programming state is reached.

7. The method of claim 1, further comprising utilizing the characterization parameter to perform at least one of:
predicting long-term degradation of the resistive memory element;
managing error-correction codes used with the resistive memory element;
managing redundancy used with the resistive memory element;
managing wear of the resistive memory element; and
assigning a quality-of-service to the resistive memory element.

8. The method of claim 7, wherein the resistive memory element comprises a selected memory cell of a plurality of memory cells, and wherein the characterization parameter used to modify the data access operation affecting all of the plurality of memory cells.

9. The method of claim 1, wherein the characterization procedure is repeated under different temperatures.

10. The method of claim 1, wherein the characterization procedure further involves measuring a third resistance of a neighboring resistive memory element in response to the signal being applied to the resistive memory element, wherein the characterization parameter is formed further based on the third resistance.

11. The method of claim 10, wherein the resistive memory element and neighboring resistive element are part of a memory block, the method further comprising utilizing the characterization parameter to perform at least one of:
predicting long-term degradation of the memory block;
modifying read or write operations directed to the memory block;
managing error-correction codes used with the memory block;
managing redundancy used with the memory block;
managing wear of the memory block; and
assigning a quality-of-service to the memory block.

12. The method of claim 1, wherein the incremental signal is increased by an incremental voltage for each repetition of the characterization procedure.

13. The method of claim 1, wherein the incremental signal comprises a non-zero duration and non-zero peak voltage signal for at least one of repetition of the characterization procedure.

14. The method of claim 1, wherein the incremental signal varies during the characterization procedure.

15. An apparatus comprising:
a controller capable of being coupled to a plurality of resistive memory elements and configured to repeatedly perform a characterization procedure involving:
applying a signal to a selected element of the plurality of resistive memory elements, a peak voltage of the signal being incremented by an incremental voltage that is less than a minimum programming voltage step of the selected element;
measuring a first resistance of the selected element in response to the signal being applied; and
measuring a second resistance of the selected element after a time period has elapsed from the measurement of the first resistance with no programming signal applied;
wherein the controller is further configured to modify a data access operation affecting the selected element in response to the first and second resistance measurements of the characterization procedure.

16. The apparatus of claim 15, wherein the data access operation is modified using at least one of:
changes in the first resistances between different repetitions of the characterization procedure; and
changes in the second resistances between the different repetitions of the characterization procedure.

17. The apparatus of claim 15, wherein the data access operation is modified using a difference between the first resistance and the second resistance of a same repetition of the characterization procedure.

18. The apparatus of claim 15, wherein the controller is further configured, in response to the first and second resistance measurements of the characterization procedure, to perform at least one of:
predicting long-term degradation of the resistive memory elements;
managing error-correction codes used with the resistive memory elements;
managing redundancy used with the resistive memory elements;
managing wear of the resistive memory elements; and
assigning a quality-of-service to the resistive memory elements.

19. The apparatus of claim 15, wherein the characterization procedure further involves measuring a third resistance of a neighboring element in response to the signal applied to the selected element, and wherein the controller is further configured to modify the data access operation affecting the selected element in response to the third resistance measurements of the characterization procedure.

20. The apparatus of claim 15, wherein the characterization procedure is repeated until a predetermined programming state of the selected element is reached.

21. An apparatus comprising:
a controller capable of being coupled to a plurality of resistive memory elements and configured to repeatedly perform a characterization procedure involving:
applying a signal to a selected element of the plurality of resistive memory elements, a duration of the signal being incremented during each subsequent application by an amount that is less than a minimum programming time of the selected element;
measuring a first resistance in the selected element in response to the signal being applied;
measuring a second resistance in the selected element after a time period has elapsed from the measurement of the first resistance with no programming signal applied;
wherein the controller is further configured to perform modifying a data access operation affecting the selected element in response to the first and second resistance measurements of the characterization procedure.

22. The apparatus of claim 21, wherein the signal is further increased by an incremental voltage for each repetition of the characterization procedure, wherein the incremental voltage is less than a minimum programming voltage step of the selected element.

* * * * *